US010312017B2

(12) United States Patent
Huang et al.

(10) Patent No.: US 10,312,017 B2
(45) Date of Patent: Jun. 4, 2019

(54) SYMMETRICAL STEP-UP AND STEP-DOWN AUTOTRANSFORMER DELTA TOPOLOGY

(71) Applicant: THE BOEING COMPANY, Chicago, IL (US)

(72) Inventors: Jian Huang, Everett, WA (US); Eugene V. Solodovnik, Lake Stevens, WA (US); Kamiar J. Karimi, Kirkland, WA (US)

(73) Assignee: THE BOEING COMPANY, Chicago, IL (US)

( * ) Notice: Subject to any disclaimer, the term of this patent is extended or adjusted under 35 U.S.C. 154(b) by 160 days.

(21) Appl. No.: 15/423,434

(22) Filed: Feb. 2, 2017

(65) Prior Publication Data

US 2017/0148566 A1 May 25, 2017

Related U.S. Application Data

(62) Division of application No. 14/328,937, filed on Jul. 11, 2014, now Pat. No. 9,601,258.

(51) Int. Cl.
*H01F 27/29* (2006.01)
*H01F 30/12* (2006.01)
(Continued)

(52) U.S. Cl.
CPC .............. *H01F 30/12* (2013.01); *H01F 27/29* (2013.01); *H01F 30/02* (2013.01); *H02M 7/04* (2013.01); *H02M 7/08* (2013.01); *H05K 7/20927* (2013.01)

(58) Field of Classification Search
CPC .......... H01F 27/00–27/36; H01F 30/02; H01F 30/12
(Continued)

(56) References Cited

U.S. PATENT DOCUMENTS 4,779,181 A 10/1988 Traver et al.
5,148,357 A 9/1992 Paice
(Continued)

FOREIGN PATENT DOCUMENTS

CN 101661827 A 3/2010
CN 103066915 A 4/2013
FR 2875971 A1 3/2006

OTHER PUBLICATIONS

European Search Report for EP15176387, dated Dec. 17, 2015.
(Continued)

*Primary Examiner* — Tuyen T Nguyen
(74) *Attorney, Agent, or Firm* — Patterson + Sheridan, LLP

(57) ABSTRACT

A multi-phase autotransformer (10) is disclosed. The exemplary transformer includes primary windings PWA, PWB, PWC) and secondary windings (SWA1-SWA4, SWB1-SWB4, SWC1-SWC4). The primary windings are connected in a delta configuration and to a three-phase input voltage source. Each secondary winding is electrically connected to a primary winding but is magnetically coupled to a different primary winding. Three sets of secondary windings provide three three-phase outputs (350A, 350B, 350C), each of which has a voltage which is less than the three-phase input voltage, the three-phase output of each set being phase-shifted with respect to the other sets. These three sets also, collectively, provide a multi-phase output (325). Another set of secondary windings, in conjunction with the input voltage, provides another multi-phase phase output (360) which has approximately the same voltage as the three-phase input voltage.

19 Claims, 5 Drawing Sheets

(51) Int. Cl.
    *H02M 7/04*     (2006.01)
    *H01F 30/02*     (2006.01)
    *H02M 7/08*     (2006.01)
    *H05K 7/20*     (2006.01)

(58) Field of Classification Search
    USPC .............................. 336/180–184; 363/20–25
    See application file for complete search history.

(56) References Cited

U.S. PATENT DOCUMENTS

| | | |
|---|---|---|
| 5,619,407 A | 4/1997 | Hammond |
| 6,671,188 B2 * | 12/2003 | Morita .................... H02M 1/34 |
| | | 363/21.01 |
| 6,680,854 B2 * | 1/2004 | Morita .................... H02M 1/34 |
| | | 363/23 |
| 7,772,953 B2 | 8/2010 | Huang et al. |
| 7,772,954 B2 | 8/2010 | Huang et al. |
| 2010/0148899 A1 | 6/2010 | Huang et al. |
| 2016/0012960 A1 * | 1/2016 | Huang .................... H01F 27/29 |
| | | 363/64 |

OTHER PUBLICATIONS

CN Office Action for Application No. 201510381351.6 dated Dec. 27, 2017.

Zhe Chen, "Power Electronic Device and Converter Technology Q&A,," Nov. 2009, 1st edition.

\* cited by examiner

SYMMETRICAL STEP-UP AND STEP-DOWN AUTOTRANSFORMER DELTA TOPOLOGY

CROSS-REFERENCE TO RELATED APPLICATIONS

This application is a divisional of U.S. patent application Ser. No. 14/328,937, filed Jul. 11, 2014 and entitled "SYMMETRICAL STEP-UP AND STEP-DOWN AUTOTRANSFORMER DELTA TOPOLOGY", which issued on Mar. 21, 2017 as U.S. Pat. No. 9,601,258. This patent application is herein incorporated by reference in its entirety.

BACKGROUND

In many applications, especially shipboard and aircraft applications, a high voltage direct current (DC) power is used to power motor controllers. Typically, a three phase alternating current (AC) voltage of 230 VAC (RMS voltage) is generated in a ship or an aircraft. The generated AC voltage is applied to an auto transformer rectifier unit (ATRU) and rectified to generate a voltage of ±270 VDC. The rectified DC voltage from the ATRU is then used to power the motor controllers. Other shipboard and aircraft applications, however, may require different DC output voltages. For example, multiple different voltage levels are required in modern aircraft for motor controllers in different zones. Higher voltages may be used in controlled pressure zones so as to reduce the size of feeder cables; whereas lower voltages are preferred in uncontrolled pressure zones so reduce the risk of corona, especially at higher altitudes. In addition, still other applications require an AC voltage.

In some power system configurations, use of separate power supplies and transformers to provide power for each of these different applications increases the size, cost, weight, and cooling requirements for the overall system, which is especially undesirable in aircraft applications. The placement of some power supplies and transformers limits the cooling to be air-cooled. Further, simply placing all of the various power supplies and transformers in a single area or compartment does not noticeably reduce the size, cost, weight, or cooling requirements for the overall system.

SUMMARY OF THE DISCLOSURE

This Summary provides a general description of a multi-phase transformer and a power supply which uses the multi-phase transformer, as further described in the Detailed Description below. This Summary is not intended to, and may not be used to, limit the scope of the claimed subject matter.

The multi-phase transformer has primary windings and multiple sets of secondary windings. The primary windings are arranged in a delta configuration to receive a three-phase input voltage, each primary winding has a center tap and a plurality of taps disposed symmetrically about the center tap.

In an embodiment, in a first set of paired secondary windings, there are preferably three pairs. The secondary windings of a pair are electrically connected to taps symmetrically located on opposite sides of the center tap of the primary winding. Each winding in a pair is also magnetically coupled to a predetermined primary winding different from that to which it is electrically connected. Each secondary winding of a pair has a first end connected to the tap on the primary winding and a second end to provide an output.

In an embodiment, in a second set of paired secondary windings, there are also preferably three pairs. The secondary windings of a pair are electrically connected to taps symmetrically located on opposite sides of the center tap of the primary winding. Each winding in a pair is also magnetically coupled to a predetermined primary winding different from that to which it is electrically connected. Each secondary winding of a pair has a first end connected to the tap on the primary winding and a second end to provide an output. The secondary windings of this second set are connected to different taps than the paired secondary windings of the first set.

In an embodiment, the center taps collectively provide a first three-phase output, the second end of a first winding of each pair of secondary windings of the first set collectively provide a second three-phase output, and the second end of a second winding of each pair of secondary windings of the first plurality collectively provide a third three-phase output.

In an embodiment, the center taps and the second ends of the paired secondary windings of the first set collectively provide a first multi-phase output.

In an embodiment, the second ends of the paired secondary windings of the second set, collectively, along with the AC input voltage, provide a second multi-phase output.

In an embodiment, the first, second, and third three-phase output voltages and the first multi-phase output voltage are each about one-half of the input voltage, and the second multi-phase output voltage is about the same as the input voltage.

Also disclosed is a power supply, such as for, but not necessarily for, a ship or an aircraft which uses the multi-phase transformer. In an embodiment, the first multi-phase output is provided to a first 18-pulse rectifier to provide a first DC output voltage, and the second multi-phase output is provided to another 18-pulse rectifier to provide a second DC output voltage, which is preferably higher than the first DC output voltage. Thus, this single power supply can replace the various power supplies and transformers previously used, reduce the overall size, reduce the overall cost, reduce the overall weight, and allow for liquid cooling of the system.

"First", "second", and "third" are used herein to identify components or items having similar names, and do not necessarily indicate an order, preference, or importance.

DETAILED DESCRIPTION

In the following detailed description, references are made to the accompanying drawings that form a part hereof, and which are shown by way of illustration, specific embodiments, or examples. Like numerals represent like elements in the several figures. The embodiments described herein are illustrative, for the purpose of teaching one of ordinary skill in the art, and are not intended to limit the scope of the disclosure. Also, the various features, functions, and advantages discussed herein can be achieved independently in different embodiments or may be combined with other embodiments.

Some of the reference designations used herein are as follows:

PWA, PWB, PWC: Primary windings A, B, and C;

A, B, C: Junctions of the primary windings, end points of the primary windings;

CTA, CTB, CTC: Center tap or contact point for primary winding PWA-PWC;

TA1-TA4: Tap or contact points for primary winding PWA;

TB1-TB4: Tap or contact points for primary winding PWB;

TC1-TC4: Tap or contact points for primary winding PWC;

SWA1-SWA4, SWB1-SWB4, SWC1-SWC4: Secondary windings;

SA1-SA4: External end or contact for secondary windings SWA1 through SWA4;

SB1-SB4: External end or contact for secondary windings SWB1 through SWB4; and

SC1-SC4: External end or contact for secondary windings SWC1 through SWC4

Figure 1:
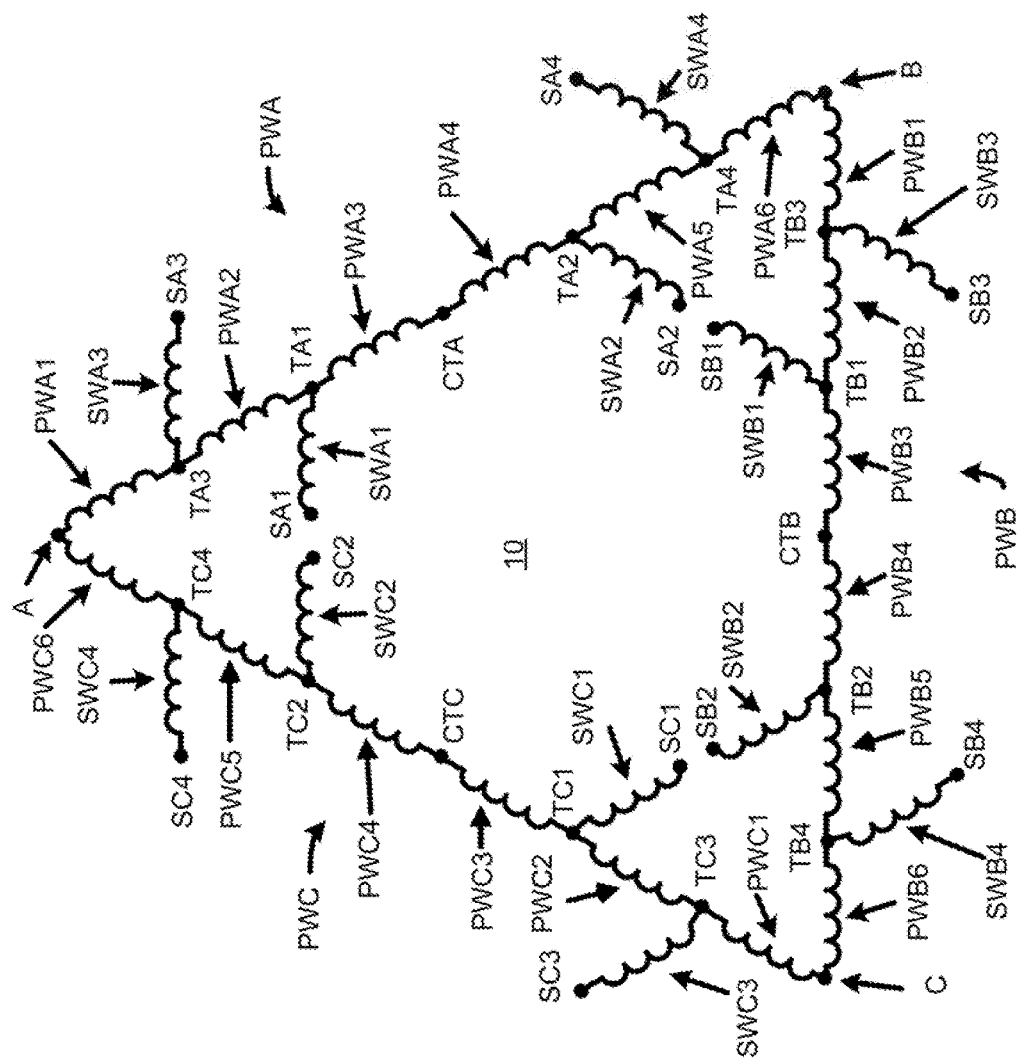
FIG. 1 is a winding diagram for an exemplary multi-phase autotransformer.

FIG. 1 is a winding diagram of an exemplary multi-phase transformer 10. Transformer 10 has three primary windings PWA, PWB, PWC connected end-to-end in a delta configuration: one end of primary winding PWA being connected to one end of primary winding PWB at junction B, the other end of primary winding PWB being connected to one end of primary winding PWC at junction C, and the other end of primary winding PWC being connected to the other end of primary winding PWA at junction A. A primary winding PWA, PWB, PWC may be several windings connected in series or a single winding having several tap points. For example, primary winding A may be considered as comprising a single winding having a plurality of tap points TA1 TA2, TA3, TA4, CTA, or primary winding A may be considered as comprising windings PWA1, PWA2, . . . PWA6 connected in series at junction points TA1, TA2, TA3, TA4, CTA.

The tap points TA1 and TA2 are symmetrical with respect to, and on opposite sides of, the center tap point CTA. Likewise, the tap points TA3 and TA4 are symmetrical with respect to, and on opposite sides of, the center tap point CTA. Tap points TA1 and TA3 are on one side of the center tap CTA, and tap points TA2 and TA4 are on the other side with respect to the tap CTA. In one embodiment, a tap TA1, TB1, TC, TA2, TB2, or TC2 is located at a point one-third of the distance between the center tap and the end of its respective primary winding.

Four secondary windings SWA1, SWA2, SWA3, and SWA4 are connected to tap points TA1, TA2, TA3, TA4, respectively, and have output or junction points SA1, SA2, SA3, and SA4, respectively.

Secondary windings SWB1, SWB2, SWB3, SWB4, SWC1, SWC2, SWC3, and SWC4 are connected to tap points TB1, TB2, TB3, TB4, TC1, TC2, TC3, and TC4, respectively, and have output or junction points SB1, SB2, SB3, SB4, SC1, SC2, SC3, and SC4, respectively.

Primary windings PWA1, PWA6, PWB1, PWB6, PWC1, and PWC6 each have N3 relative turns; primary windings PWA2, PWA5, PWB2, PWB5, PWC2, and PWC5 each have N2 relative turns; and primary windings PWA3, PWA4, PWB3, PWB4, PWC3, and PWC4 each have N1 relative turns. Secondary windings SWA1, SWA2, SWB1, SWB2, SWC1, and SWC2 each have N5 relative turns; and secondary windings SWA3, SWA4, SWB3, SWB4, SWC3, and SWC4 each have N4 relative turns. "Relative turns" means the number of turns relative to another winding, such as the primary winding PWA1. Preferably, the number of turns is an integer. For example, if N3 (for winding PWA1) is defined as being one (1) relative turn then in one embodiment N1 will be INT(N3*20.04/20.55), N2 will be INT(N3*25.90/20.55), N4 will be INT(N3*38.26/20.55), and N5 will be INT(N3*8.38/20.55), where INT(x) indicates the integer function. These values for Nx are derived from FIG. 2B, discussed below. In one embodiment, N3 is actually 20 turns, so N1 would actually be 20 turns, N2 would be 25 turns, N4 would be 37 turns, and N5 would be 8 turns. Different numbers of turns and ratios may be used, depending upon such factors as, but not limited to, the frequency of the input voltage, the power requirements of each of the various connected subsystems, the desired output voltages, the minimum no-load impedance of the transformer 10, the core material, the core cross-sectional area, material saturation, losses, etc.

Consider now the arrangement and results of the various outputs provided by the transformer 10. The three primary windings PWA, PWB, and PWC are preferably constructed as close to being identical as permitted by manufacturing techniques in use, the materials used, cost considerations, and time considerations. Likewise, secondary windings SWA1, SWA2, SWB1, SWB2, SWC1 and SWC2 are preferably constructed as close to being identical as permitted by manufacturing techniques in use, the materials used, cost considerations, and time considerations. Also, secondary windings SWA3, SWA4, SWB3, SWB4, SWC3 and SWC4 are preferably constructed as close to being identical as permitted by manufacturing techniques in use, the materials used, cost considerations, and time considerations.

The voltage at a center tap is one-half of the voltage between the junctions. That is, the voltage at center tap CTA for example, will be one-half of the voltage VAB between junctions A and B, and likewise for the voltage at center taps CTB and CTC. Thus, the output voltage for the three center taps will be one-half of the input voltage. For example, if the input is three-phase, 230 volts, then the output collectively provided by the center taps will be three-phase 115 volts. Note that, as this is a three-phase system, the line-to-line voltage (VAB, VBC, VCA) will be 230√13, or approximately 400 volts, so the center-tap to center-tap output voltage will be 115√13, or approximately 200 volts. The center taps CTA, CTB, and CTC collectively provide a first three-phase output which has a voltage which is one-half of the input voltage at input junctions A, B, and C.

Taps TA1, TB1 and TC1 are evenly spaced around the delta configuration so they also provide a three-phase output. This three-phase output may not, however, directly provide the desired output voltage and phase. Therefore, rather than using the outputs of these taps directly, the outputs of secondary windings SWA1, SWB1, and SWC1 are used. A secondary winding, SWA1, SWB1, and SWC1, is electrically coupled to a predetermined tap on its respective predetermined primary winding, PWA, PWB, PWC, but is magnetically coupled to a different predetermined primary winding, PWB, PWC, PWA, respectively, to provide different, phase-shifted voltages at outputs SA1, SB1, SC1, respectively. Also, each of these secondary windings SWA1, SWB1, SWC1 is magnetically coupled to a different predetermined primary winding than the other two of these secondary windings. In one embodiment, the voltage induced across these secondary windings is in opposition to the voltage at taps TA1, TB1 and TC1 so that the voltage at outputs SA1, SB1 and SC1, respectively, is one-half of the input voltage and is phase shifted by 40 degrees with respect to the phase of the voltage at CTA, CTB, and CTC, respectively. The output points SA1, SB1, SC1 collectively provide a second three-phase output which has a voltage which is one-half of the input voltage at input junctions A, B, and C. This second three-phase output is phase-shifted with respect to the first three-phase output.

Taps TA2, TB2 and TC2 are likewise evenly spaced around the delta configuration, but on the opposite side of center taps CTA, CTB, and CTC, respectively, so they also provide a three-phase output. This three-phase output may not, however, directly provide the desired output voltage and phase. Therefore, rather than using the outputs of these taps directly, the outputs of secondary windings SWA2, SWB2, and SWC2 are used. A secondary winding, SWA2, SWB2, SWC2, is electrically coupled to a predetermined tap on its respective predetermined primary winding, PWA, PWB, PWC, but is magnetically coupled to a different predetermined primary winding, PWC, PWA, PWB, respectively, to provide different, phase-shifted voltages at outputs SA2, SB2, SC2, respectively. Also, each of these secondary windings SWA2, SWB2, SWC2 is magnetically coupled to a different primary winding than the other two of these secondary windings. In one embodiment, the voltage induced across these secondary windings is in opposition to the voltage at taps TA2, TB2 and TC2 so that the voltage at outputs SA2, SB2 and SC2, respectively, is one-half of the input voltage and is phase shifted by 40 degrees with respect to the phase of the voltage at CTA, CTB, and CTC, respectively, but in the opposite direction of the phase shifts with respect to outputs SA1, SB1, SC1. The output points SA2, SB2, SC2 collectively provide a third three-phase output which has a voltage which is one-half of the input voltage at junctions A, B, and C. This third three-phase output is phase-shifted with respect to both the first three-phase output and the second three-phase output.

The center taps CTA, CTB, CTC of the primary windings, and the output points SA1, SA2, SB1, SB2, SC1, SC2 collectively provide a first multi-phase output. In one embodiment, this output has a voltage which is one-half of the input voltage applied at junctions A, B, and C, this output voltage being selected because of the power requirements of the load devices.

Note that, in the embodiment discussed above, the voltage at outputs SA1, SA2, SB1, SB2, SC1, SC2, CTA, CTB, and CTC are all the same—one-half of the input voltages VAB, VBC, VCA. These outputs are, however, phase-shifted with respect to each other so, in effect, they also collectively provide a nine-phase output, the phases being separated by 40 degrees.

Taps TA3, TB3 and TC3 are likewise evenly spaced around the delta configuration so they also provide a three-phase output. This three-phase output may not, however, directly provide the desired output voltage and phase. Therefore, rather than using the outputs of these taps directly, the outputs of secondary windings SWA3, SWB3, and SWC3 are used. A secondary winding, SWA3, SWB3, SWC3, is electrically coupled to its respective primary winding, PWA, PWB, PWC, respectively, but is magnetically coupled to a different predetermined primary winding, PWB, PWC, PWA, respectively, to provide different, phase-shifted voltages at output SA3, SB3, SC3, respectively. In one embodiment, the voltage induced across these secondary windings is in reinforcement to the voltage at taps TA3, TB3 and TC3 so that the voltage at outputs SA3, SB3 and SC3, respectively, is the same as the input voltage and is phase shifted by 40 degrees with respect to the input voltage.

Taps TA4, TB4 and TC4 are likewise evenly spaced around the delta configuration so they also provide a three-phase output. This three-phase output may not, however, directly provide the desired output voltage and phase. Therefore, rather than using the outputs of these taps directly, the outputs of secondary windings SWA4, SWB4, and SWC4 are used. A secondary winding, SWA4, SWB4, SWC4, is electrically coupled to its respective primary winding, PWA, PWB, PWC, but is magnetically coupled to a different predetermined primary winding, PWC, PWA, PWB, respectively, to provide different, phase-shifted voltages at outputs SA4, SB4, SC4, respectively. In one embodiment, the voltage induced across these secondary windings is in reinforcement to the voltage at taps TA4, TB4 and TC4 so that the voltage at outputs SA4, SB4 and SC4, respectively, is the same as the input voltage and is phase shifted by 40 degrees with respect to the input voltage, but in the opposite direction of the phase shifts with respect to outputs SA3, SB3, SC3.

Also, in the embodiment discussed above, the voltage at outputs SA3, SA4, SB3, SB4, SC3, and SC4 are all the same as the input voltages VAB, VBC, VCA. These outputs are, however, phase-shifted with respect to the input voltages VAB, VBC, VCA so, in effect, and along with the input voltages, they also collectively provide a nine-phase output, the phases also being separated by 40 degrees.

The output points SA3, SA4, SB3, SB4, SC3, SC4 collectively provide a second multi-phase output which has a voltage which is the same as the input voltage applied at junctions A, B, and C, this output voltage being selected because of the power requirements of the load devices.

An advantage of these multi-phase output voltage arrangements is that any subsequent rectification process has less ripple and therefore requires less filtering and smoothing than a rectification process which operates on, for example, a two-phase or a three-phase input voltage. For example, the ±270 VDC output has a peak-to-peak ripple voltage of only about 4 volts.

Secondary windings SWA1 and SWA2 may be considered to be a first pair of a first plurality of paired secondary windings, secondary windings SWB1 and SWB2 may be considered to be a second pair of a first plurality of paired secondary windings, and secondary windings SWC1 and SWC2 may be considered to be a third pair of a first plurality of paired secondary windings. A first secondary winding of a pair of these paired secondary windings has a first end and a second end, the first end is electrically connected to a tap on a first side of the center tap of a predetermined primary winding of the plurality of primary windings, and the first secondary winding is magnetically coupled to a primary winding of the plurality of primary windings other than the predetermined primary winding to which it is electrically connected. A second secondary winding of the pair has a first end and a second end, the first end is electrically connected to a tap on a second, opposing side of the center tap of the predetermined primary winding, and the second secondary winding is magnetically coupled to a primary winding other than the predetermined primary winding to which it is electrically connected and other than the primary winding to which the first secondary winding is magnetically coupled. Also, the predetermined primary winding for a pair of the first plurality of paired secondary windings is other than the predetermined primary winding for any other pair of the first plurality of paired secondary windings.

Secondary windings SWA3 and SWA4 may be considered to be a first pair of a second plurality of paired secondary windings, secondary windings SWB3 and SWB4 may be considered to be a second pair of the second plurality of paired secondary windings, and secondary windings SWC3 and SWC4 may be considered to be a third pair of the second plurality of paired secondary windings. A first secondary winding of a pair of these paired secondary windings has a first end and a second end, the first end is electrically connected to a tap on a first side of the center tap of a predetermined primary winding of the plurality of primary windings, and the first secondary winding is magnetically coupled to a primary winding of the plurality of primary windings other than the predetermined primary winding to which it is electrically connected. A second secondary winding of a pair has a first end and a second end, the first end is electrically connected to a tap on a second, opposing side of the center tap of the predetermined primary winding, and the second secondary winding is magnetically coupled to a primary winding other than the predetermined primary winding to which it is electrically connected and other than the primary winding to which the first secondary winding is magnetically coupled. Also, the predetermined primary winding for a pair of the second plurality of paired secondary windings is other than the predetermined primary winding for any other pair of the second plurality of paired secondary windings.

Figure 2A:
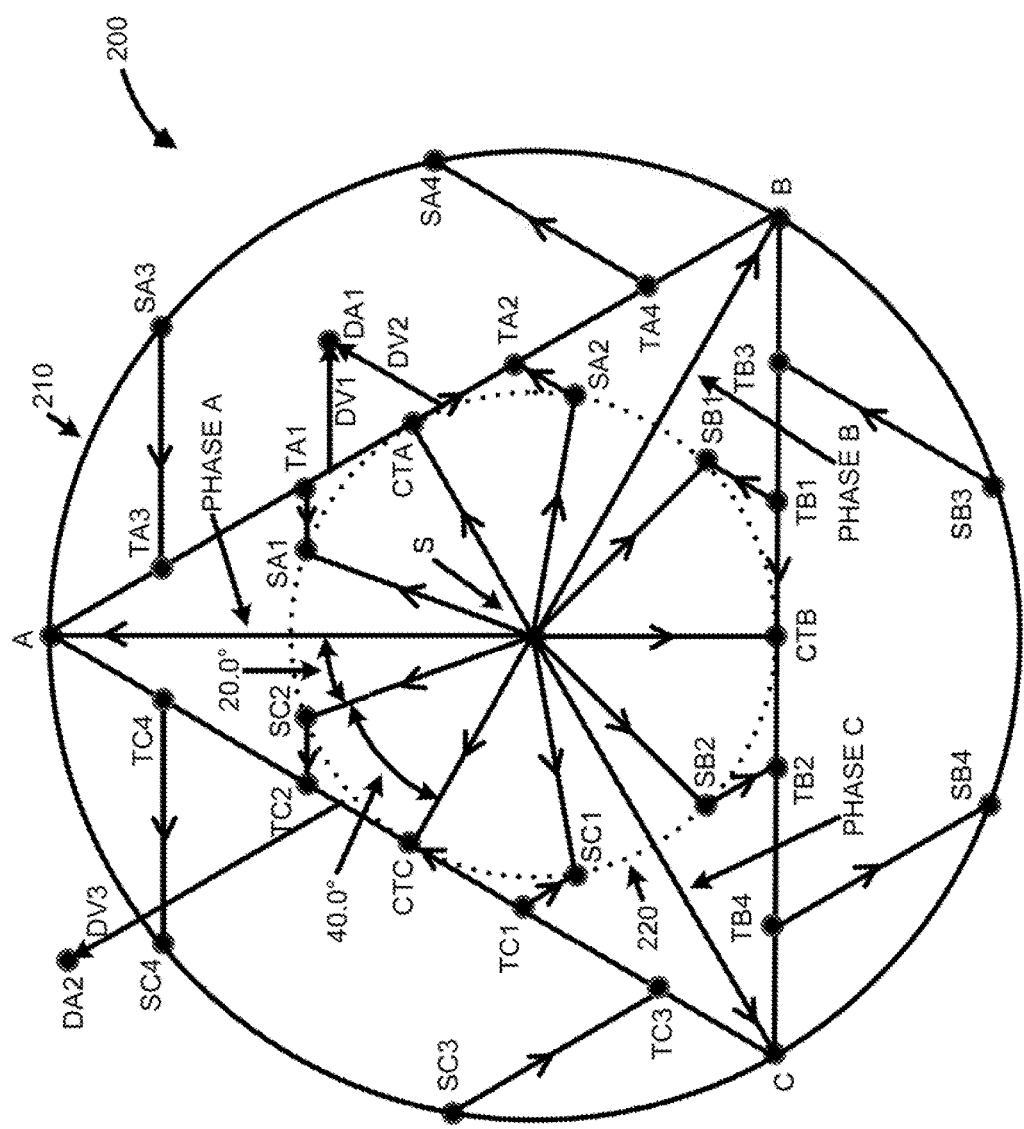
FIG. 2A is an exemplary phasor diagram for the exemplary multi-phase autotransformer of FIG. 1.

FIG. 2A is an exemplary phasor diagram for the exemplary multi-phase transformer 10 of FIG. 1. The phasor diagram graphically depicts various aspects the multi-phase transformer, such as the relationship between the various windings. A dot represents a contact point, a junction, or a tap point (e.g., A, TA3, TA1 CTA, TA2, TA4, B, SA3, SA1, SA2, SA4, etc.). Various windings are represented by lines in the phasor diagram between the contact points and, as indicated above, the length of a line between the contact points generally represents the relative number of turns of a winding with respect to another winding, such as, but not limited to, a primary winding.

Figure 2B:
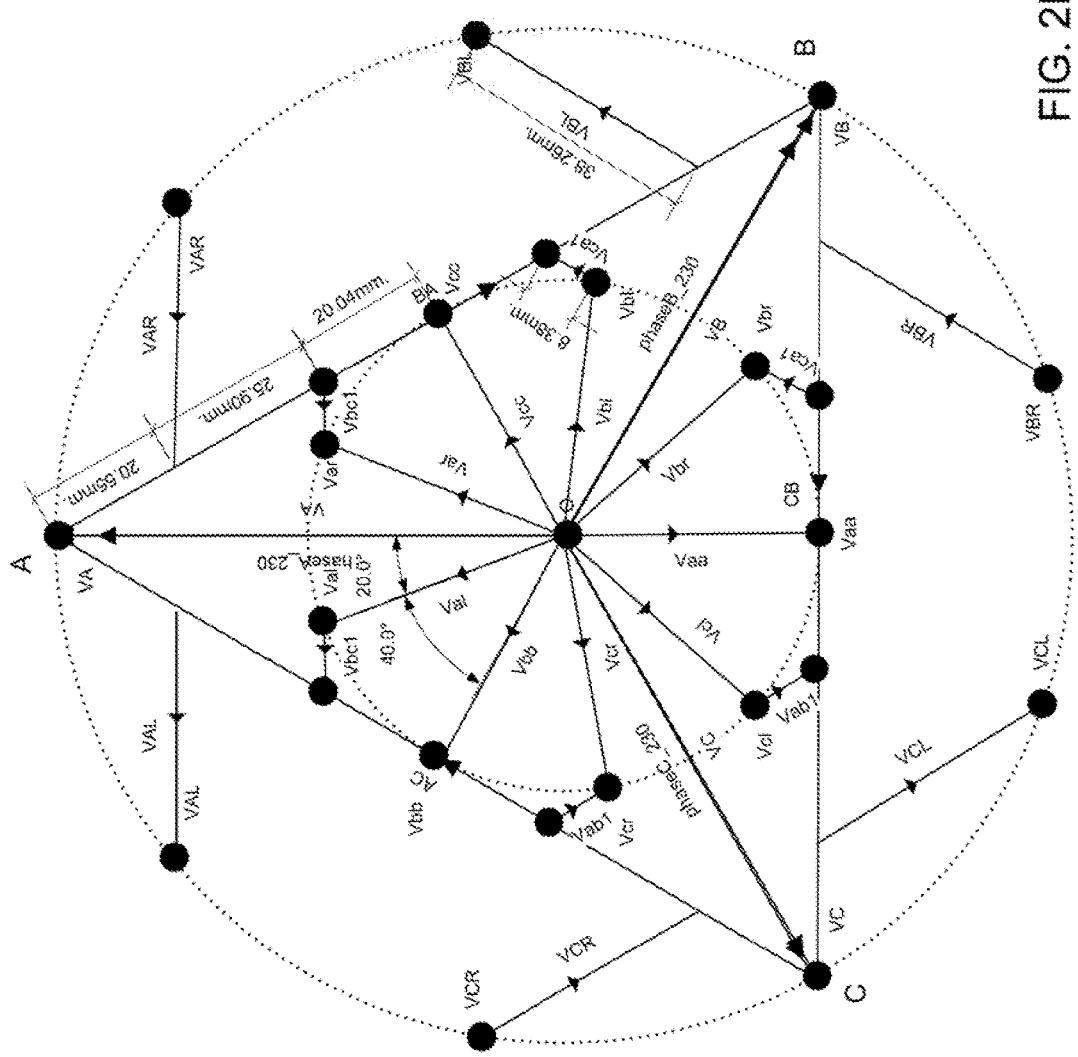
FIG. 2B is the exemplary phasor diagram of FIG. 2A with the line lengths indicated thereon.

FIG. 2B is the exemplary phasor diagram of FIG. 2A with the line lengths indicated thereon. For example, the line lengths for N1, N2, N3, N4 and N5 are 20.04, 25.90, 20.55, 38.26, and 8.38, respectively. Thus, N1/N3=20.04/20.55=0.975. Therefore, if N3=20 turns, then N1=INT (19.5036 . . . )=20 turns. Ratios and the number of turns for the other windings are similarly determined.

The lines are vector lines depicting the vector of the induced voltage. Two vector lines that are parallel to each other represent magnetic coupling between corresponding two windings. For example, line SA3-TA3 is parallel to line BC, which indicates that secondary winding SWA1 is magnetically coupled to primary PWB, line SC3-TC3 is parallel to line AB, which indicates that secondary winding SWC3 is magnetically coupled to primary PWA, and line TB1-SB1 is parallel to line CA, which indicates that secondary winding SWB1 is magnetically coupled to primary PWC. The radial length of each segment between two junctions along the circumference represents the phase angle difference between the output signals at those junctions, with the full circle representing 360 degrees. The common center of the circle represents the effective electrical neutral position.

The phasor diagram 200 includes a first circle 210 (for example, 230 VAC) and a second circle 220 (for example, 115 VAC), both having a common center S. The sides AB, BC and CA of triangle ABC represent the primary windings PWA, PWB, and PWC respectively. Points TA1, TA2, CTA, TB1, TB2, CTB, TC1, TC2, and CTC correspond to the tap points of the primary windings PWA-PWC. Lines A-TA3, TA3-TA1, TA1-CTA, CTA-TA2, TA2-TA4, and TA4-B represent portions (sub-primary windings) PWA1, PWA2, PWA3, PWA4, PWA5 and PWA6, respectively, of the primary windings. Lines B-TB3, TB3-TB1, . . . , TB4-C, C-TC3, TC3-TC1, . . . , TC4-A, represent similar sub-primary windings on primary windings PWB and PWC.

Lines TA1-SA1, TA2-SA2, TB1-SB1, TB2-SB2, TC1-SC1, TC2-SC2 represent one group or set of secondary windings, SWA1, SWA2, SWB1, SWB2, SWC1, SWC2, respectively, and lines TA3-SA3, TA4-SA4, TB3-SB3, TB4-SB4, TC3-SC3, TC4-SC4 represent another group or set of secondary windings, SWA3, SWA4, SWB3, SWB4, SWC3, SWC4, respectively.

Points SA1-SA4, SB1-SB4, and SC1-SC4 represent the second (output) end of secondary windings SWA1-SWA4, SWB1-SWB4, and SWC1-SWC4, respectively.

The lines SA, SB and SC represent the input AC voltage applied to the exterior junctions A, B and C of the primary windings. As it is evident from the phasor diagram, a three phase input voltage is depicted as phase A, phase B, and phase C, with each phase being separated by about 120 degrees. In one environment, such as an aircraft, the input voltages SA, SB and SC are 230 volts. Other input voltages may be used, and other output voltages may be provided, as desired.

As previously described, the lines in the phasor diagram 200 are vector lines depicting the vector of the induced voltage. For example, the vector of induced voltage in primary windings AB, BC and CA are depicted by the arrows on the lines SA, SB and SC. Similarly, the arrows on lines representing the secondary windings represent the vector of induced voltage. For example, arrows on lines TA1-SA1 and SA3-TA3 represent the vector of induced voltage in secondary windings SWA1 and SWA3, respectively.

The vector of induced voltage in a secondary winding is selected to boost or buck the voltage at the tap point on a primary winding to provide the desired output voltage and/or phase.

Figure 3:
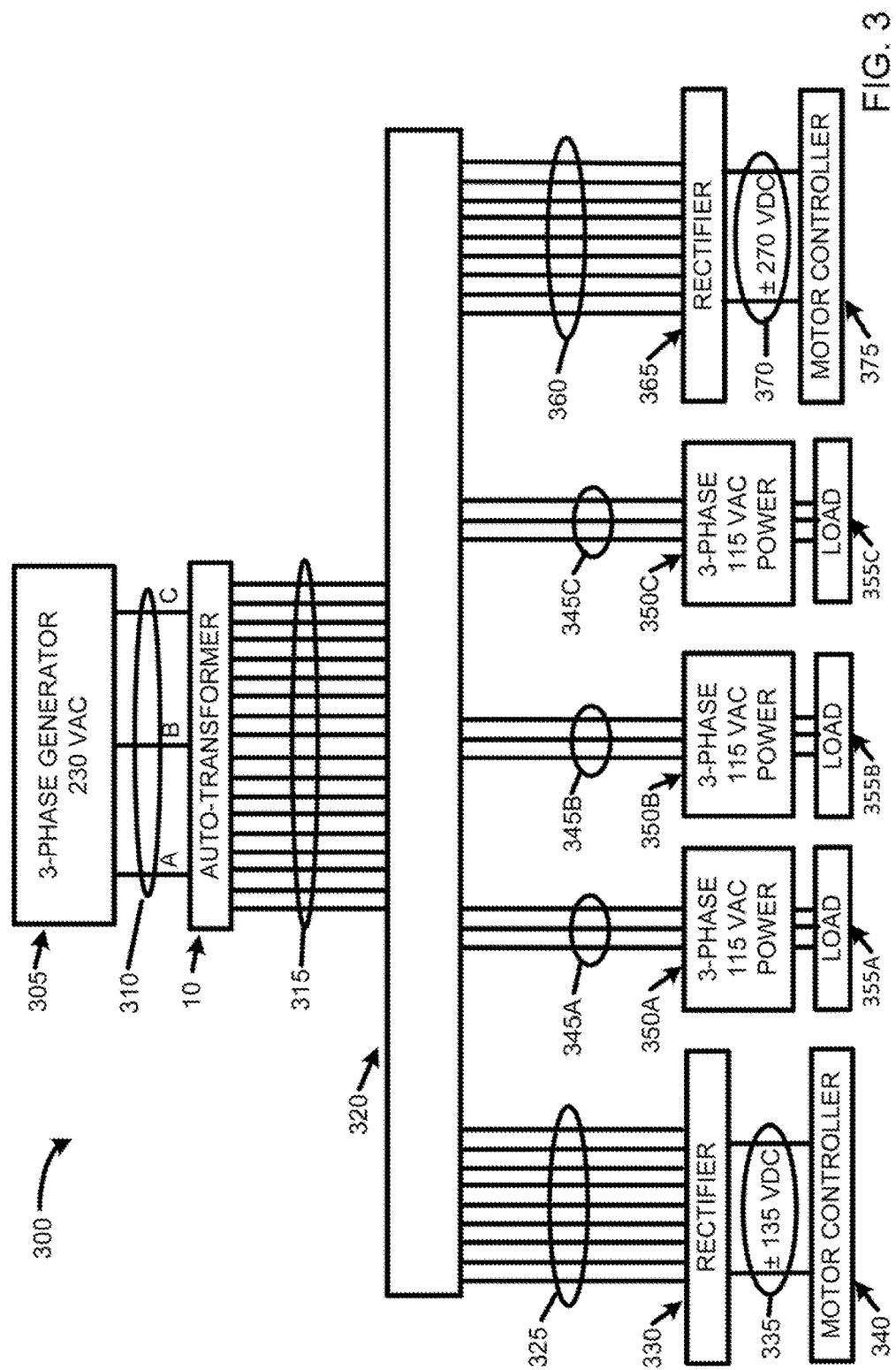
FIG. 3 shows an exemplary power supply system for use with the exemplary autotransformer of FIG. 1.

FIG. 3 shows an exemplary power supply system 300 for use with the exemplary autotransformer 10. The power supply system 300 includes a three-phase, 230 VAC generator 305, an autotransformer 10, buses 310, 315, 325, 345A, 345B, 345C, and 360, 18-pulse rectifiers 330 and 365, and motor controllers 340 and 375. The generator 305 provides three-phase, 230 VAC power over bus 310 to autotransformer 10. Autotransformer 10 provides a plurality of outputs 315, eighteen in one embodiment, to various components via bus 320. The eighteen outputs, as seen from FIGS. 1 and 2, are SA1-SA4, SB1-SB4, SC1-SC4, CTA, CTB, CTC, A, B, and C. Bus 320 is indicated as a single bus for convenience of illustration. Although bus 320 may carry all eighteen outputs to each receiving component, that is not a preferable configuration. Rather, the bus 320 comprises a plurality of smaller buses, 325, 345A, 345B, 345C, 360, each of which carries only those outputs required by a particular receiving component. For example, bus 325 carries outputs SA1, SA2, SB1, SB2, SC1, SC2, CTA, CTB, and CTC to 18-pulse rectifier 330, which rectifies these outputs to provide ±135 VDC power over bus 335 to a first motor controller 340. The design and operation of 18-pulse rectifiers and motor controllers is well known to those of ordinary skill in the art.

Note that transformer 10 provides three sets of outputs: SA1, SB1, and SC1; SA2, SB2, and SC2; and CTA, CTB, and CTC. Also note that these three output sets differ from each other by approximately 40 degrees. That is, for example, output SA1 will lead output CTA by approximately 40 degrees, output CTA will lead output SA2 by approximately 40 degrees, output SA2 will lead output SB1 by approximately 40 degrees, output SB1 will lead output CTB by approximately 40 degrees, etc. Thus, full-wave rectification of these three output sets provides an 18-pulse output at ±135 VDC.

Similarly, bus 360 carries outputs SA3, SA4, SB3, SB4, SC3, and SC4, along with the input voltage A, B, and C, to 18-pulse rectifier 365, which rectifies these outputs to provide ±270 VDC power over bus 370 to a second motor controller 375. Note that transformer 10 provides two sets of outputs: SA3, SB3, and SC3; SA4, SB4, and SC4; and the input voltages A, B, and C are passed through as another output set. Also note that these three output sets differ from each other by approximately 40 degrees. That is, for example, output A will lead output SA3 by approximately 40 degrees, output SA3 will lead output SA4 by approximately 40 degrees, output SA4 will lead output B by approximately 40 degrees, output B will lead output SB3 by approximately 40 degrees, etc. Thus, full-wave rectification of these three output sets also provides an 18-pulse output, but at ±270 VDC rather than ±135 VDC.

Bus 345A carries outputs SA1, SB1, and SC1, which provides a first source 350A of 3-phase, 115 VAC power to load 355A. Bus 345B carries outputs SA2, SB2, and SC2, which provides a second source 350B of 3-phase, 115 VAC power to load 355B. Likewise, bus 345C carries outputs CTA, CTB, and CTC, which provides a third source 350C of 3-phase, 115 VAC power to load 355C. Note that the buses 345A, 345B and 345C differ from each other by approximately 40 degrees, as described above. This distributes the load of the receiving devices 355A-355C more evenly throughout a cycle of input AC power.

Note that the multiple AC and DC outputs described herein have been achieved with a single transformer having only 15 windings: the three primary windings (PWA, PWB, PWC), and the 12 secondary windings (SWA1-SWA4, SWB1-SWB4, and SWC1-SWC4).

In an exemplary environment, such as with respect to an aircraft, the three three-phase 115 VAC loads 355A-355C are traditional loads, such as galley appliances. The ±270 VDC output powers high-power motor controllers, such as the motor controller for the cabin air pressure. The ±135 VDC output powers lower-power motor controllers, such as the motor controllers for the electrically-operated brakes for the aircraft.

Preferably, the system 300 replaces multiple existing Auto Transformer Units (ATUs), Galley Auto Transformer Units (GATUs), Electric-Brake Power Supply Units (E-BPSU), which are air-cooled devices with a single, liquid-cooled, Auto Transformer Rectifier Unit (ATRU). This reduces size and weight, which result is especially desirable for aircraft applications. In addition, replacing the multiple conventional power supply/transformer units by a single ATRU causes liquid cooling to become feasible. The liquid cooling allows for a higher heat dissipation efficiency than that of an air-cooled system. The smaller size and weight, and higher heat dissipation efficiency, allow the system 300 to be placed in locations where air-cooling might be difficult or impossible.

Figure 4:
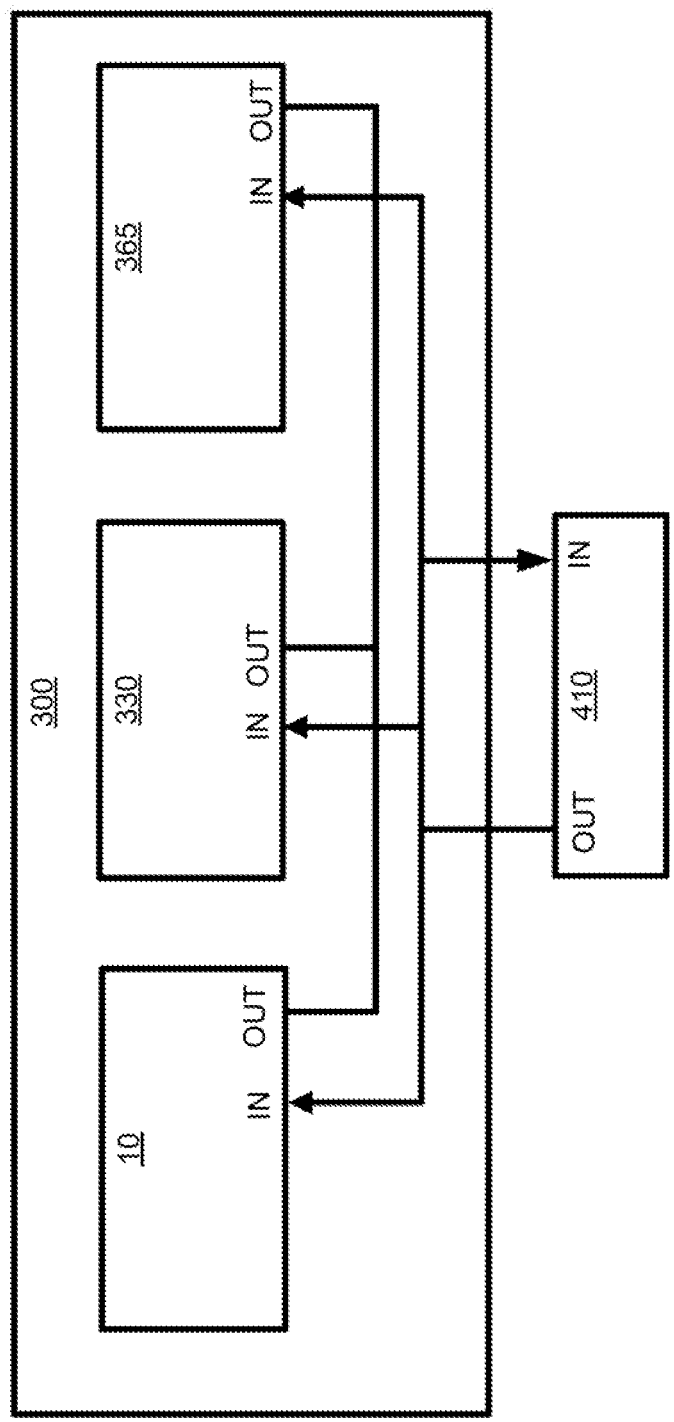
FIG. 4 is a diagram of an exemplary power supply system with liquid cooling.

FIG. 4 is a diagram of an exemplary power supply system 300 with liquid cooling. The liquid pump and reservoir unit 410 pumps cooling liquid to the transformer 10 and the rectifier units 330, 365. Liquid cooling techniques for transformers and for electronic circuits and devices are known and are not discussed here.

Although the exemplary embodiment has been described with reference to three phase-shifted three-phase 115 VAC outputs, a multi-phase 115 VAC output to provide a ±135 VDC output, and a multi-phase 230 VAC output to provide a ±270 VDC output, the disclosure is not limited to this specific embodiment. For example, more tap points can be provided on the primary windings, and more secondary windings can be provided, so as to achieve other phase shifts and output voltages. For example, a tap point could be added between TA1 and CTA, and a secondary winding added, magnetically coupled to primary winding PWB or PWC, to provide a different, desired output voltage and phase (preferably, but not necessarily, with similar tap points and secondary windings added with respect to primary windings PWB and PWC). One can, for example, determine a particular desired output voltage and phase, for example, point DA1 on FIG. 2, determine the vector between DA1 and the relevant primary winding PWA, and thereby determine the tap point on the primary winding and the magnetic coupling and strength of the secondary winding. Note that, depending upon the desired output voltage and phase, the desired result may, in some cases, be achieved by one or more different vectors, such as vector DV1 (secondary winding electrically connected to a tap on primary winding PWA and magnetically coupled to primary winding PWB), and vector DV2 (secondary winding electrically connected to a different tap on primary winding PWA and magnetically coupled to primary winding PWC). To achieve a three-phase output at that voltage and phase, one would then determine two other points at that same voltage, but phase-shifted by 120 degrees, and use similarly situated tap points, secondary windings, and magnetic couplings with respect to the respective primary winding.

In the embodiments discussed above, the output voltage has been less than or equal to the input voltage. This is not a requirement as the output voltage may be greater than the input voltage. For example, consider the output voltage and phase of DA2, the desired result may be achieved by, for example, but not limited to, vector DV3 (secondary winding electrically connected to a tap on primary winding PWC and magnetically coupled to primary winding PWA). To achieve a three-phase output at that voltage and phase, one would then determine two other points at that same voltage, but phase-shifted by 120 degrees, and use similarly situated tap points, secondary windings, and magnetic couplings with respect to primary windings PWA and PWB.

"About" and "approximately" are relative terms and indicate that, although two values may not be identical, their difference is such that the apparatus or method still provides the indicated result, or is such that a device operating from the provided output power and voltage is not adversely affected to the point where it cannot perform its intended purpose. Although exemplary vectors of induced voltages have been shown with reference to various phasor diagrams, modifications may be made to the tap points on the primary windings and to the magnetic coupling configurations of the secondary windings.

What is claimed is:

1. A power supply system, comprising:
    an autotransformer having three primary windings connected in a delta configuration to receive a three-phase input voltage and having a plurality of secondary windings, each primary winding having a center tap and plurality of taps disposed symmetrically about the center tap, each secondary winding being electrically connected to a predetermined tap of the plurality of taps on a predetermined primary winding and magnetically coupled to a primary winding other than the predetermined primary winding to which it is electrically connected, a combination of the predetermined tap and the magnetically coupled predetermined primary winding being different for each secondary winding, the primary and secondary windings providing a plurality of phase-shifted three-phase outputs and a plurality of multi-phase outputs;

a first rectifier connected to a first one of the multi-phase outputs to provide a first DC output; and a second rectifier connected to a second one of the multi-phase outputs to provide a second DC output.

2. The power supply system of claim 1 and further comprising a liquid pump and reservoir to pump cooling liquid to at least one of the autotransformer, the first rectifier, or the second rectifier.

3. The power supply system of claim 1 wherein the first rectifier provides a first DC output voltage and the second rectifier provides a second, different, output voltage.

4. The power supply system of claim 1 wherein the center taps collectively provide a said phase-shifted three-phase output.

5. The power supply system of claim 1 wherein the secondary windings are in a plurality of paired secondary windings, and wherein both secondary windings in a pair of paired secondary windings have a first end and a second end, the first end of a first secondary winding in a pair being electrically connected to a said predetermined tap on a first side of the center tap of the predetermined primary winding, the first end of a second secondary winding in a pair being electrically connected to a said predetermined tap symmetrically disposed opposite the center tap of the predetermined primary winding.

6. The power supply system of claim 5 wherein the second end of a plurality of secondary windings collectively provide a said phase-shifted three-phase output.

7. The power supply system of claim 5 wherein the center taps and the second end of a plurality of secondary windings collectively provide a said multi-phase output.

8. The power supply system of claim 5 wherein the second end of a plurality of three pairs of secondary windings and the three-phase input voltage collectively provide a said multi-phase output.

9. A power supply system, comprising:
a three-phase generator configured to generate a three-phase input voltage;
an autotransformer comprising:
three primary windings connected in a delta configuration and configured to receive the three-phase input voltage, wherein each primary winding of the three primary windings has a respective center tap and a respective plurality of taps having a symmetric arrangement about the center tap; and
a plurality of secondary windings, wherein each secondary winding of the plurality of secondary windings:
is electrically coupled with a predetermined tap of the plurality of taps that corresponds to a predetermined first primary winding of the three primary windings,
is magnetically coupled with a predetermined second primary winding of the three primary windings, and has a combination of the predetermined tap and the second primary winding that is different than combinations for other secondary windings of the plurality of secondary windings;

one or more buses coupled with the autotransformer and configured to provide a plurality of phase-shifted three-phase outputs and a plurality of multi-phase outputs;

a first rectifier connected to a first bus of the one or more buses, the first bus providing a first multi-phase output of the plurality of multi-phase outputs, the first rectifier configured to provide a first direct current (DC) output; and a second rectifier connected to a second bus of the one or more buses, the second bus providing a second multi-phase output of the plurality of multi-phase outputs, the second rectifier configured to provide a second DC output that is different than the first DC output.

10. The power supply system of claim 9, wherein one or both of the first rectifier and the second rectifier comprises an 18-pulse rectifier.

11. The power supply system of claim 9, wherein the center taps corresponding to the three primary windings provide a first phase-shifted three-phase output of the plurality of phase-shifted three-phase outputs.

12. The power supply system of claim 11, wherein the plurality of taps having a symmetric arrangement about the center tap comprises:
a first tap disposed on a first side of the center tap; and
a second tap disposed on an opposing second side of the center tap,
wherein a second phase-shifted three-phase output of the plurality of phase-shifted three-phase outputs is provided via the first taps corresponding to the three primary windings, and
wherein a third phase-shifted three-phase output of the plurality of phase-shifted three-phase outputs is provided via the second taps corresponding to the three primary windings.

13. The power supply system of claim 12,
wherein for each primary winding of the three primary windings:
a first secondary winding of the plurality of secondary windings defines a first end coupled with the first tap, and further defines an opposing second end, and
a second secondary winding of the plurality of secondary windings defines a third end coupled with the second tap, and further defines an opposing fourth end,
wherein the second phase-shifted three-phase output is provided at the second ends corresponding to the three primary windings, and
wherein the third phase-shifted three-phase output is provided at the fourth ends corresponding to the three primary windings.

14. The power supply system of claim 12, wherein the first tap and the second tap are each arranged with a distance from the center tap that is one-third a distance between the center tap and an end of the primary winding.

15. The power supply system of claim 12, wherein a first multi-phase output of the plurality of multi-phase outputs is provided by the center taps, first taps, and second taps corresponding to the three primary windings.

16. The power supply system of claim 12, wherein the plurality of taps having a symmetric arrangement about the center tap comprises:
a third tap disposed between the first tap and a first end of the primary winding; and a fourth tap disposed between the second tap and a second end of the primary winding, wherein a third phase-shifted three-phase output of the plurality of phase-shifted three-phase outputs is provided via the third taps corresponding to the three primary windings, and wherein a fourth phase-shifted three-phase output of the plurality of phase-shifted three-phase outputs is provided via the fourth taps corresponding to the three primary windings.

17. The power supply system of claim 16, wherein a first multi-phase output of the plurality of multi-phase outputs is provided by the center taps, first taps, and second taps corresponding to the three primary windings, and wherein a second multi-phase output of the plurality of multi-phase outputs is provided by the third taps and the fourth taps corresponding to the three primary windings.

18. A method comprising:

determining a combination of an output voltage and an output phase to be provided by an autotransformer, the autotransformer comprising first, second, and third primary windings connected in a delta configuration and configured to receive a three-phase input voltage;

determining, for a secondary winding to be electrically coupled to a tap point of the first primary winding, a plurality of induced voltage vectors between the combination and the first primary winding, wherein each induced voltage vector of the plurality of induced voltage vectors corresponds to (i) a respective potential location for the tap point on the first primary winding and (ii) a respective amount of magnetic coupling between the secondary winding with a selected one of the second and third primary windings; and selecting, from the potential locations corresponding to the plurality of induced voltage vectors, a location for the tap point on the first primary winding.

19. The method of claim 18, wherein each of the first, second, and third primary windings has a respective center tap and a respective plurality of taps having a symmetric arrangement about the center tap, and wherein the autotransformer further comprises a plurality of secondary windings, wherein each secondary winding of the plurality of secondary windings:
is electrically coupled with a predetermined tap of the plurality of taps that corresponds to a predetermined one primary winding of the three primary windings,
is magnetically coupled with a predetermined other primary winding of the three primary windings, and
has a combination of the predetermined tap and the other primary winding that is different than combinations for other secondary windings of the plurality of secondary windings.

* * * * *